United States Patent [19]

Bartilson

[11] Patent Number: 5,166,775

[45] Date of Patent: Nov. 24, 1992

[54] AIR MANIFOLD FOR COOLING ELECTRONIC DEVICES

[75] Inventor: Bradley W. Bartilson, Chippewa Falls, Wis.

[73] Assignee: Cray Research, Inc., Chippewa Falls, Wis.

[21] Appl. No.: 664,940

[22] Filed: Mar. 5, 1991

Related U.S. Application Data

[63] Continuation of Ser. No. 465,042, Jan. 16, 1992, Pat. No. 5,083,194.

[51] Int. Cl.$^5$ ..................... H01L 23/02; H01L 39/02
[52] U.S. Cl. ................................. 361/383; 361/384; 165/80.3; 257/221
[58] Field of Search ....................... 357/74, 80, 81, 82; 361/381, 382, 383, 384; 165/80.3

[56] References Cited

U.S. PATENT DOCUMENTS

| | | | |
|---|---|---|---|
| 2,948,518 | 8/1960 | Kraus | 257/313 |
| 3,065,384 | 11/1962 | Sprude | 317/101 |
| 3,070,729 | 12/1962 | Heidler | 317/100 |
| 3,141,999 | 7/1964 | Schneider | 317/100 |
| 3,198,991 | 8/1965 | Barnett | 317/100 |
| 3,417,814 | 12/1968 | Oktay | 165/105 |
| 3,527,989 | 9/1970 | Cuzner et al. | 317/100 |
| 3,737,728 | 6/1973 | Austin | 317/100 |
| 3,741,292 | 6/1973 | Aakalu et al. | 165/105 |
| 3,851,221 | 11/1974 | Beaulieu et al. | 317/100 |
| 3,999,105 | 12/1976 | Archey et al. | 317/100 |
| 4,072,188 | 2/1978 | Wilson et al. | 165/80 |
| 4,104,700 | 8/1978 | Hutchison et al. | 361/384 |
| 4,204,247 | 5/1980 | Wigley | 361/387 |
| 4,283,754 | 8/1981 | Parks | 361/382 |
| 4,420,739 | 12/1983 | Herren | 338/53 |
| 4,450,472 | 5/1984 | Tuckerman et al. | 357/82 |
| 4,535,385 | 8/1985 | August et al. | 361/388 |
| 4,536,824 | 8/1985 | Barrett et al. | 361/384 |
| 4,628,407 | 12/1986 | August et al. | 361/388 |
| 4,758,926 | 7/1988 | Herrell et al. | 362/385 |
| 4,839,774 | 6/1989 | Hamburgen | 361/383 |
| 4,884,168 | 11/1989 | August et al. | 361/382 |
| 5,014,904 | 5/1991 | Morton | 228/176 |

FOREIGN PATENT DOCUMENTS

| | | | |
|---|---|---|---|
| 0129966 | 3/1988 | European Pat. Off. | 23/36 |
| 1274165 | 11/1986 | U.S.S.R. | 361/384 |
| 2204181 | 11/1988 | United Kingdom | 23/36 |

OTHER PUBLICATIONS

"Liquid Jet Cooling of Integrated Circuit Chips", *IBM Technical Disclosure Bulletin*, vol. 20, No. 9, Feb. 1978.
"Circuit Module Package", *IBM Technical Disclosure Bulletin*, vol. 21, No. 9, Feb. 1979.
"Heat Dissipator Assemblies", *IBM Technical Disclosure Bulletin*, vol. 8, No. 10, Mar. 1966.
"Local Heat Transfer to Staggered Arrays of Impinging Circular Array Jets", by Behbahani & Goldstein, 1983 Transactions of the ASME, vol. 105, pp. 354–359.
"Heat Transfer with Impinging Jets", by Goldstein, Proceeding of the Symposium on Non-Linear Problems in Energy Engineering, Argon National Labs 1983, pp. 7–15.
"Flow Visualization in an Impinging Circular Air Jet", by Behbahani, Disimile & Aydore, 1989 National Heat Conference HTD vol. 112, Heat Transfer Measurements, Analysis and Flow Visualization.
"Cooling of a Multichip Electronic Module by Means of Confined Two-Dimensional Jets of Dielectric Liquid", by Wadsworth & Mudawar, 1989 National Heat Transfer Conference, HTD vol. 111, Heat Transfer in Electronics—1989.
"Impingement Cooling of Electronics", by Hollworth & Durbin, 1989 National Heat Transfer Conference, HTD vol. 111, Heat Transfer in Electronics—1989.
"Air Jet Impingement Cooling of an Array of Simulated Electronics Packages", by Hamadah, 1989 National Heat Transfer Conference, HTD vol. 111, Heat Transfer in Electronics—1989.
"Impingement Cooling of a Simulated Electronics Package with a Square Array of Round Air Jets", by Hamadah, 1989 National Heat Transfer Conference, HTD vol. 111, Heat Transfer in Electronics—1989.
"Local Heat Transfer Coefficients Under an Axisymmetric, Single-Phase Liquid Jet", by Stevens & Webb, 1989 National Heat Transfer Conference, HTD vol. 111, Heat Transfer in Electronics—1989.
"Jet Impingement Flow Boiling of a Mixture of FC-72 and FC-87 Liquids on a Simulated Electronic Chip", by Nonn, Dagan & Jiji, 1989 National Heat Transfer Conference, HTD vol. 111, Heat Transfer in Electronics—1989.

"Thermal Performance Characteristics of Air-Cooled Cold Plates for Electronic Cooling", by Yimer & Bouzid, 1989 National Heat Transfer Conference, HTD vol. 111, Heat Transfer in Electronics—1989.

"Building Parallelism into the Instruction Pipeline", by Chan and Horst, High Performance Systems, Dec. 1989, pp. 53-60.

*Computer Design*, vol. 23, No. 14, Dec. 1984, AT&T Technologies, Inc., (Littleton, Ma. U.S.A.), "IBM Packs in High Density Circuits", pp. 254-255.

"Experimental Investigation of Multi-Jet Impingement Cooling of an Array of Microelectronic Heat Sources", by L. M. Jiji and Z. Dagan, Aug. 1986.

"High-Performance Heat Sinking for VLSI", by D. B. Tuckerman and R. F. W. Pease, IEEE Electron Device Letters, vol. EDL-2, No. 5, May 1981, pp. 126-129.

"Heat Transfer in Forced Convection Through Fins", by Robert W. Keyes, IEEE Transactions on Electron Devices, vol. ED-31, No. 9, Sep. 1984, pp. 1218-1221.

"Heat-Transfer Microstructures for Integrated Circuits" by D. B. Tuckerman, Feb. 1984, Stanford University.

"Inpingement Cooling of Electronics: Effects of Venting Through Circuit Board", by B. R. Hollworth, K. A. Maxwell, and L. S. Ukeiley, pp. 80-96, IEPS Conference (Sep. 11-18, 1989).

"Heat Transfer From Pin-Fins Situated in an Oncoming Longitudinal Flow Which Turns to Crossflow," by E. M. Sparrow and E. D. Larson, *Int. J. Heat Mass Transfer*, vol. 25, No. 5, pp. 603-614, 1982.

"Performance Comparisons Among Geometrically Different Pin-Fin Arrays Situated in an Oncoming Longitudinal Flow," by E. D. Larson and E. M. Sparrow, *Int. J. Heat Mass Transfer*, vol. 25, No. 5, pp. 723-725, 1982.

"Heat Sinks Cool Hot Computers", *Tooling & Production*, Jul. 1991.

"Heat Sinks for Gate Arrays", by Melvin Moore, Thermalloy, Inc., Electronic Packaging and Production, pp. 96-99, (Jan. 1988).

"Thermal Impact of Double-Sided Printed Circuit Cards", by T. L. Davis, IBM Systems Technology Division, ASME Conference, (1987).

"Forced-Convection, Liquid-Cooled, Microchannel Heat Sinks for High-Power-Density Microelectronics", by R. J. Phillips, L. R. Glicksman, and R. Larson, pp. 295-316, (Jan. 1988).

"Effect of Inlet, Exit, and Fin Geometry on Pin Fins Situated in a Turning Flow," by E. M. Sparrow et al., *Int. J. Heat Mass Transfer*, vol. 27, No. 27, pp. 1039-1053, (1984).

*Primary Examiner*—Rolf Hille
*Assistant Examiner*—David Ostrowski
*Attorney, Agent, or Firm*—Merchant, Gould, Smith, Edell, Welter & Schmidt

[57] ABSTRACT

An air manifold mounted adjacent to a circuit board for directing air jets onto electronic devices mounted on the circuit board. The air manifold has an air inlet and a plurality of outlet nozzles positioned along the channel for directing air onto the electronic devices. A plurality of members are positioned next to the nozzles with the members increasing in length as the distance between the inlet and the outlets increase.

1 Claim, 3 Drawing Sheets

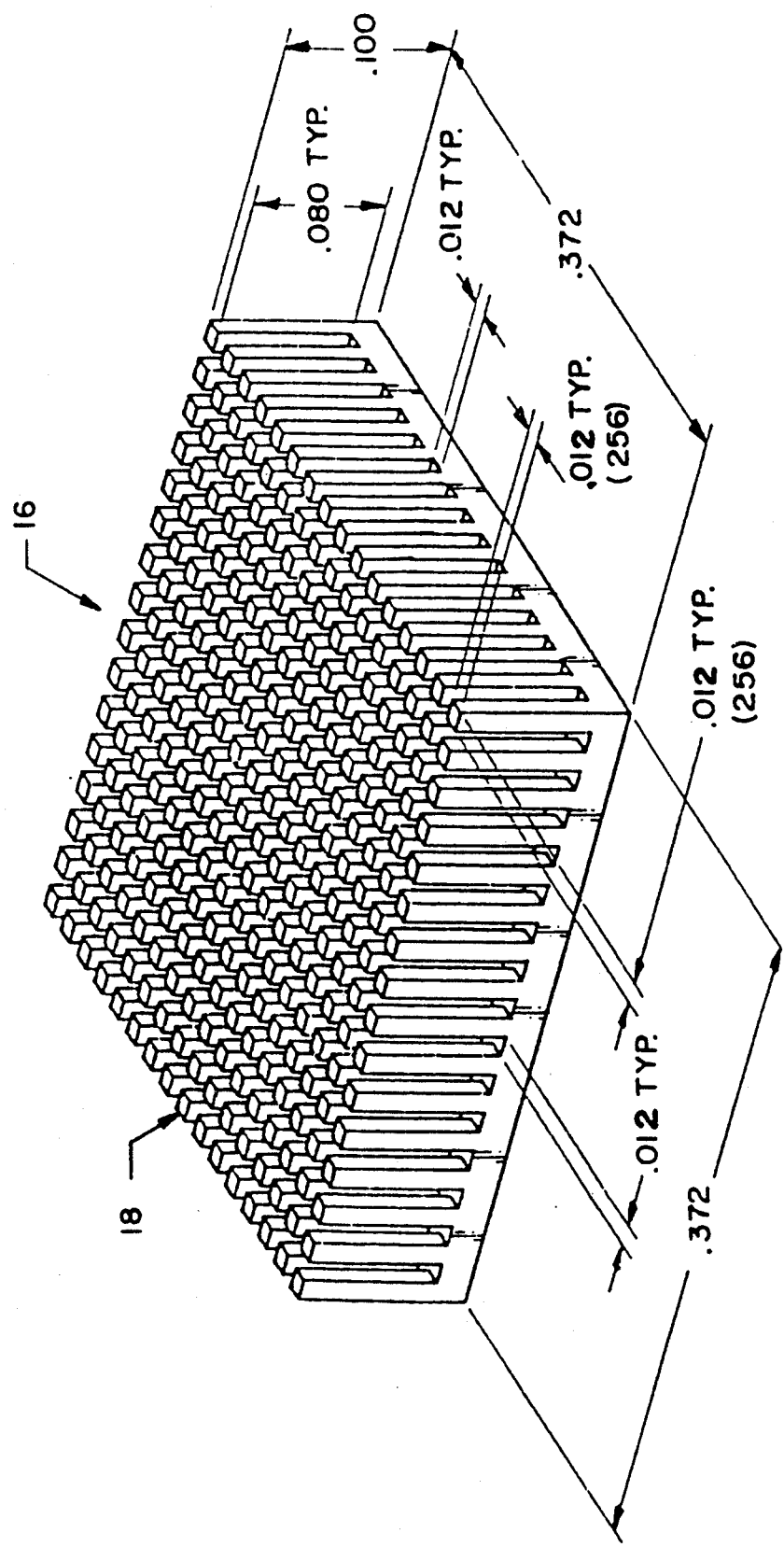

AIR MANIFOLD FOR COOLING ELECTRONIC DEVICES

This is a continuation of U.S. patent application Ser. No. 07/465,042, filed Jan. 16, 1990, now U.S. Pat. No. 5,083,194, issued Jan. 21, 1992.

BACKGROUND OF THE INVENTION

1. Field of the Invention

The present invention relates generally to a cooling system for use with electronic devices, and more particularly, to an air jet impingement cooling method used with a miniature pin-fin heat sink.

2. Description of Related Art

Mechanisms to remove the heat from microelectronic packages are receiving greater attention due to the inherent power density increases associated with higher levels of integration. This is especially true with the microelectronic packages used in supercomputers, for example, those manufactured by Cray Research, Inc., the Assignee of the present invention.

The techniques which the packaging engineer may use to reject these high levels of heat generation often conflict with electrical design parameters and goals. More specifically, the greater speed of these packages may require closer spacing, or the project may set goals to package the system within a given volume, thus reducing the available volume within which the thermal "conduit" may exist.

The techniques employed for cooling microelectronic packages must also be reviewed at each packaging level. For example, a low temperature coolant technique may produce efficient packaging at the chip and board level, and yet require extensive hardware and volume at the higher packaging levels.

Air-cooled electronic systems traditionally exhibit large board-to-board spacing to allow room for heat sinks and also to create a low-resistance fluid path. A number of difficulties are present in this situation:

1) The path of least resistance for the fluid is around the heat sinks. Thus, much of the fluid passes by the IC packages unheated.

2) The fluid often follows a cross flow path across an array of IC packages on a printed circuit board, so that the packages furthest downstream are exposed to a higher temperature fluid due to heat gain from upstream packages.

3) In general, the heat sink size must be proportional to the heat generation of the IC package.

SUMMARY OF THE INVENTION

To overcome the limitations in the prior art described above, and to overcome other limitations that will become apparent upon reading and understanding this specification, the present invention combines an air-jet impingement cooling method with a miniature pin-fin heat sink to provide equivalent fluid flow to each IC package in a module and to achieve a high heat transfer rate per volume. The present invention describes an air manifold for efficient distribution of air to support the air jet impingement method.

DESCRIPTION OF THE DRAWINGS

In the drawings, where like numerals refer to like elements throughout the several views:

FIG. 2 is a top view of a miniature pin-fin heat sink;

DETAILED DESCRIPTION OF THE PREFERRED EMBODIMENT

In the following detailed description, reference is made to the accompanying drawings which form a part hereof and in which is shown by way of illustration a preferred embodiment in which the invention may be practiced. It is to be understood that other embodiments may be utilized and that structural changes may be made without departing from the scope of the present invention.

The preferred embodiment of the present invention combines an air-jet impingement cooling method with a miniature pin-fin heat sink. Such an arrangement provides equal fluid flow to each microelectronic package and maximizes the heat transfer rate.

Figure 1:
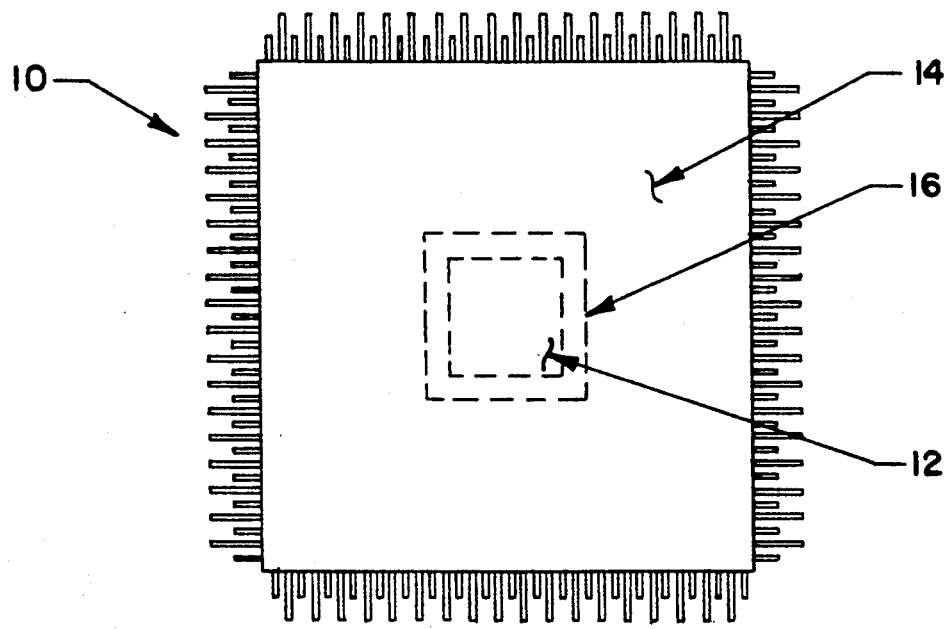
FIG. 1 is a top view of an integrated circuit.

High levels of integration for a microelectronic package inevitably results in increases in the power density of the package. FIG. 1 is a top view of a dense microelectronic package, i.e., a typical 2500 gate array integrated circuit 10 comprised of a silicon die 12 and a ceramic package 14. The silicon die 12 measures approximately $0.265'' \times 0.265'' \times 0.020''$ and is mounted in the center of the ceramic package 14, which measures approximately $1.14'' \times 1.14'' \times 0.105''$. This integrated circuit 10 may generate more than 12 watts of heat during its operation and thus requires an efficient method for dissipating heat.

An analysis of the temperature distribution throughout the ceramic package 14 shows that the primary heat path is in a small area beneath the silicon die 12. A miniature pin-fin heat sink 16 is used in the preferred embodiment to facilitate thermal transfer from the primary heat path.

The miniature pin-fin heat sink 16 facilitates thermal transfer in two ways. First, it provides greater surface area for transferring heat to the fluid. Second, it separates an impinging air jet into separate fluid paths, thereby breaking up a recovery zone that develops under the center of the air jet.

Without the miniature pin-fin heat sink 16, the impinging air jet would be directed at a planar surface, i.e., the ceramic package 14, creating a thermal boundary layer from a backwash of the air jet. The force of the air jet can push this thermal boundary layer down near the surface of the ceramic package 14, but it remains a "recovery zone" that limits the thermal efficiency of the air jet. The miniature pin-fin heat sink 16 helps reduce the recovery zone.

FIG. 2 shows the configuration of the miniature pin-fins heat sink 16 used in the preferred embodiment of the present invention. The heat sink 16 measures $0.375'' \times 0.375'' \times 0.100''$ and has 256 pin-fins 18 measuring $0.012'' \times 0.012'' \times 0.080''$ and separated by $0.010''$ channels. (For a given fin size, the surface area per volume is maximum when the channel size is equal to the fin size). Thus, the pin-fins 18 are arranged in a $16 \times 16$ matrix having a volume 0.0136 cubic inches. Those skilled in the art will recognize that further increases in the fin density produce greater heat transfer coefficients, allowing the flow rate to be reduced while maintaining the required 80° C. die temperature.

The heat sink 16 is usually centered on the ceramic package 14 and mounted to the underside thereof. The heat sink 16 may be glued to the underside of the ceramic package 14 using a crushed diamond thermal epoxy. The thickness of the thermal epoxy preferably does not exceed 0.002".

The combined technique of a high speed air jet impinging directly on a high fin density heat sink can provide a highly efficient heat transfer mechanism. Moreover, the physical space is comparable to high density packaging systems utilizing low-temperature coolant.

Figure 4:
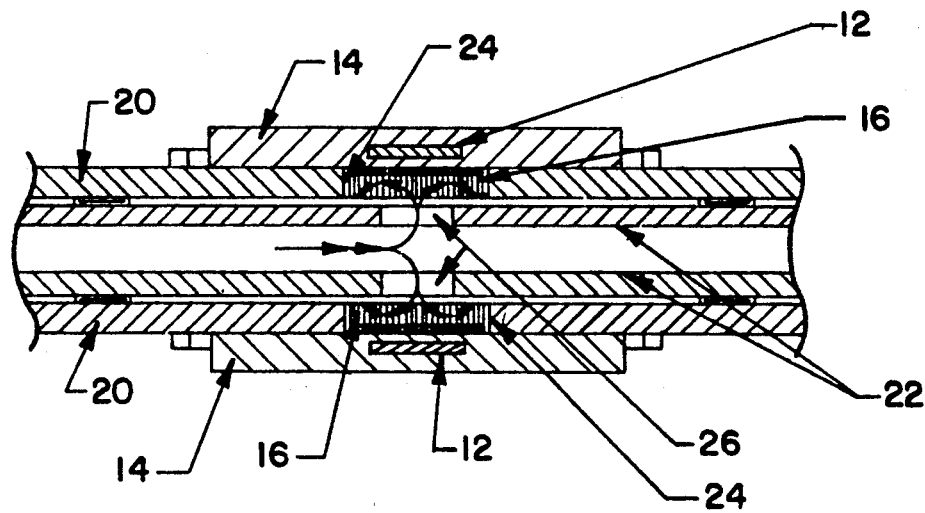
FIG. 4 is a cross-sectional side view of the logic assembly of FIG. 3.
Figure 3:
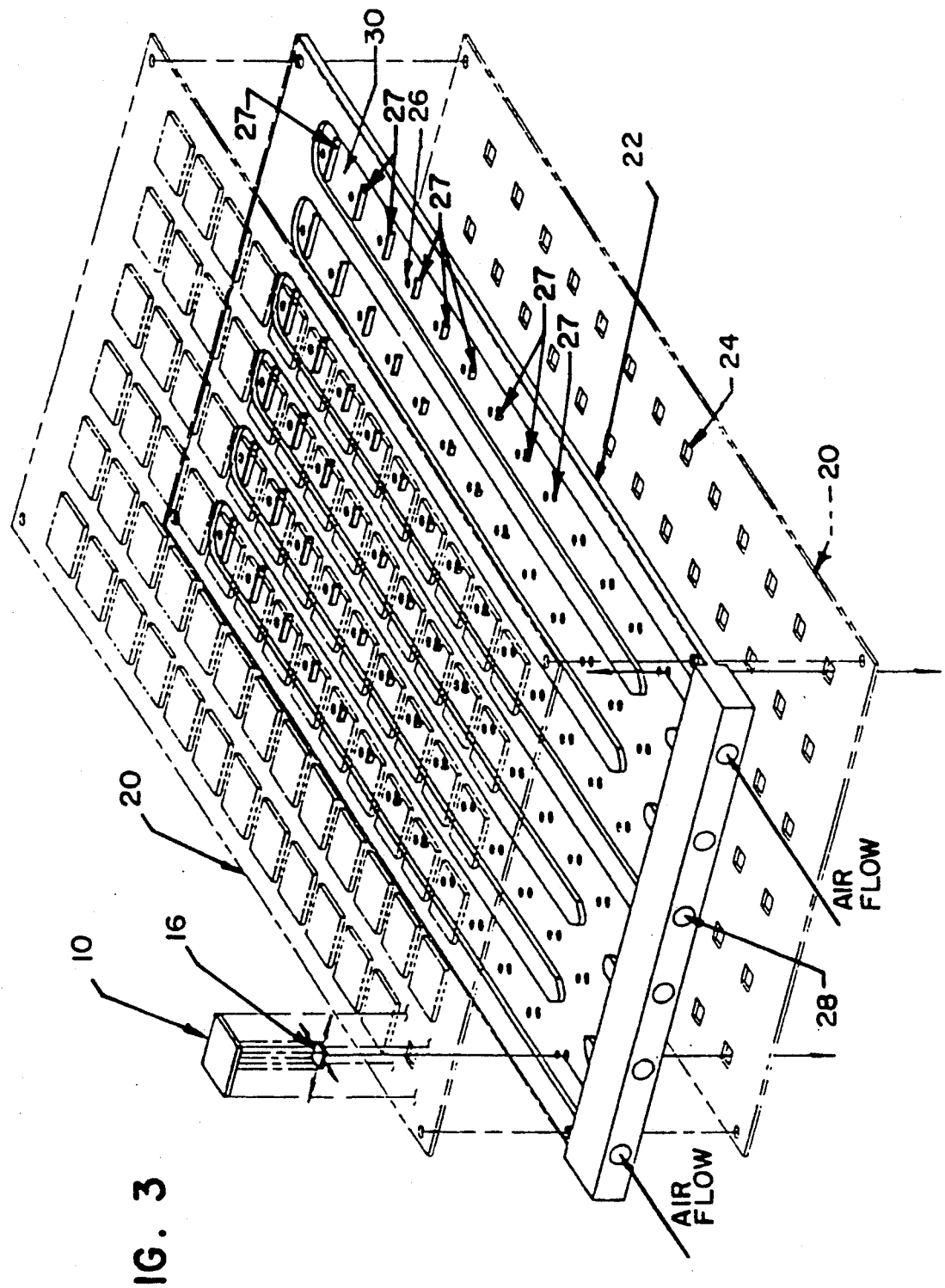
FIG. 3 is an exploded view of a multi-chip module including an air manifold with printed circuit boards mounted thereon.

FIG. 3 describes an air manifold 22, printed circuit board (PCB) 20, and integrated circuit layout for a multi-chip module in the preferred embodiment of the present invention. FIG. 4 is cross-sectional side view of the module of FIG. 3. The air manifold 22 has six 1.200"×0.125"×20.0" long channels 30 which provide equivalent air flow to 13 air jets above and below the air manifold 22. The air enters each channel 30 at an inlet 28 and exits at 26 0.200" diameter nozzles 26. Pressure boundary conditions are preferably 2.0 p.s.i.g. at the inlets 28 and 0 p.s.i.g. at the nozzles 26, thereby providing the greatest uniformity of air flow. Members 27 are positioned in front of several of the nozzles 26 to equalize and provide uniform air flow through the channel 30. The members 27 are preferably positioned in front of the last nine nozzles 26 of channel 30 and are of different lengths. The lengths of the members 27 increase as you proceed from the inlet 28 further into the channel 30.

The PCBs 20 may be attached to each side of the air manifold 22, preferably using spacers or like connectors, thereby providing a gap between the PCB 20 and the air manifold 22 for the exhaust of the air flow. In the preferred embodiment, each PCB 20 may have six rows of 13 integrated circuits 10. Each integrated circuit 10 is mounted over an aperture 24 in the PCB 20 and secured thereto by means of a wave soldering process, or some other means of attachment. The pattern of apertures 24 in the PCB 20 is preferably identical to the pattern of nozzles 26 in the air manifold 22. Attached to the underside of the ceramic package 14 and extending through the aperture 24 is the miniature pin-fin heat sink 16. An air jet with average velocity of 75 ft/sec exits from the nozzle 26 and is directed through the aperture 24, thereby directly impinging upon the miniature pin-fin heat sink 16.

In the preferred embodiment, there is little or no gap between the nozzle 26 and the top of the miniature pin-fin heat sink 16. Such a configuration provides the highest packaging efficiency and thermal transfer characteristics. Preferably, the air jet exiting from the nozzle 26 does not expand prior to impinging upon the miniature pin-fin heat sink 16, where it is broken up into separate fluid paths.

The combination of the air jet impingement cooling method with the miniature pin-fin heat sink 16 dissipates approximately 12.6 watts with the air jet speed is approximately 75 feet/second, to obtain a temperature rise of 63° C. and a corresponding thermal resistance of 5.0° C./watt. In this preferred embodiment, heat flux can exceed 10,000 Btu/hr.ft$^2$ from the miniature pin-fin heat sink 16.

While it is desirable to achieve the highest possible thermal efficiency for cooling electronic devices, it is also advantageous to avoid re-packaging multi-chip modules and assemblies. Thus, in the preferred embodiment, the air manifold is preferably identical in composition, construction, and configuration to the cold plate described in the co-pending and commonly assigned U.S. patent application, U.S. patent application Ser. No. 07/464,900, filed Jan. 16, 1990, now U.S. Pat. No. 5,014,904, by Dave M. Morton, entitled "BOARD-MOUNTED THERMAL PATH CONNECTOR AND COLD PLATE", which application is hereby incorporated by reference. By maintaining a similar configuration, the air manifold 22 may be used in place of the Morton cold plate.

Although a preferred embodiment has been illustrated and described for the present invention, it will be appreciated by those of ordinary skill in the art that any apparatus which is calculated to achieve the same purpose may be substituted for the specific configuration shown.

For example, any gas or fluid may be used with the present invention as a substitute for air. Preferably, the cooling gas or fluid used is one that flows easily, has good thermal transfer characteristics, and has minimal electrical conductivity. However, air is preferred, because it does not require expensive and cumbersome pumping and recovery systems, in contrast to what may be required for other cooling gases or fluids.

This application is intended to cover any adaptations or variations of the present invention. Therefore, it is manifestly intended that this invention be limited only by the claims and the equivalents thereof.

What is claimed is:

1. An apparatus to cool electronic devices, comprising:
    (a) an air manifold adapted for mounting a printed circuit board adjacent thereto, said circuit board having electronic devices mounted thereon, said air manifold having at least one channel therein, said at least one channel having an inlet at a first end for accepting air therein;
    (b) a plurality of nozzles positioned along said channel for expelling air therefrom to cool said electronic devices; and
    (c) a plurality of members positioned with respect to said nozzles, said members increasing in length as the distance between the inlet and members increases, said members being positioned adjacent some of said plurality of nozzles, one member per nozzle, said member positioned between said inlet and said nozzle, said some of said plurality of nozzles located at a second end of said channel.

* * * * *

UNITED STATES PATENT AND TRADEMARK OFFICE
CERTIFICATE OF CORRECTION

PATENT NO. :  5,166,775

DATED : November 24, 1992

INVENTOR(S) : Bradley W. Bartilson

It is certified that error appears in the above-identified patent and that said Letters Patent is hereby corrected as shown below:

In column 4, line 12, delete "U.S. patent application" after the word "assigned" therefore.

In column 4, line 13, "07/464,900" should read -- 07/464,909 therefore.

Signed and Sealed this

Second Day of November, 1993

Attest:

BRUCE LEHMAN

Attesting Officer

Commissioner of Patents and Trademarks